(12) United States Patent
Nomura et al.

(10) Patent No.: US 10,586,605 B2
(45) Date of Patent: Mar. 10, 2020

(54) SAMPLE HOLD CIRCUIT

(71) Applicant: ROHM CO., LTD., Kyoto-shi, Kyoto (JP)

(72) Inventors: Naohiro Nomura, Kyoto (JP); Takatoshi Manabe, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 16/194,821

(22) Filed: Nov. 19, 2018

(65) Prior Publication Data

US 2019/0156906 A1 May 23, 2019

(30) Foreign Application Priority Data

Nov. 20, 2017 (JP) .................. 2017-223026
Nov. 20, 2017 (JP) .................. 2017-223027
Oct. 16, 2018 (JP) .................. 2018-194995

(51) Int. Cl.
H03K 5/00 (2006.01)
G11C 27/02 (2006.01)
H03K 17/687 (2006.01)
H03F 3/45 (2006.01)

(52) U.S. Cl.
CPC ....... *G11C 27/026* (2013.01); *H03F 3/45179* (2013.01); *H03K 17/6872* (2013.01)

(58) Field of Classification Search
CPC .............. G11C 27/026; H03F 3/45179; H03K 17/6872
USPC .......................................... 327/94
See application file for complete search history.

(56) References Cited

U.S. PATENT DOCUMENTS 6,636,083 B1 * 10/2003 Wong .................... G11C 27/026
                                                              327/307
8,212,604 B2 *  7/2012 Dianbo ................ H03K 17/063
                                                              327/389
8,325,257 B2 * 12/2012 Noda ..................... H04N 5/378
                                                              348/222.1

FOREIGN PATENT DOCUMENTS

JP   2011150561 A   8/2011
JP   2014171035 A   9/2014

* cited by examiner

*Primary Examiner* — Dinh T Le
(74) *Attorney, Agent, or Firm* — Cantor Colburn LLP

(57) ABSTRACT

A sample hold circuit includes at least one capacitor $C_S$ and at least one complementary metal-oxide semiconductor (CMOS) switch. The CMOS switch includes an N-channel metal-oxide semiconductor (NMOS) transistor and a P-channel metal-oxide semiconductor (PMOS) transistor connected in parallel. A high level of a gate signal $V_{GN}$ of the NMOS transistor is adjusted to a voltage level $V_{REG}$ lower than a power supply voltage $V_{DD}$ of a chip on which the CMOS switch is integrated.

10 Claims, 13 Drawing Sheets

SAMPLE HOLD CIRCUIT

CROSS-REFERENCE TO RELATED APPLICATION(S)

The present application claims priority under 35 U.S.C § 119(e) to Japanese Patent Application No. 2018-194995, filed on Oct. 16, 2018, Japanese Application No. 2017-223027, filed on Nov. 20, 2017 and Japanese Application No. 2017-223026, filed on Nov. 20, 2017, the entire contents of which are incorporated herein by reference.

BACKGROUND OF THE INVENTION

1. Field of the Invention

The present invention relates to a CMOS switch.

2. Description of the Related Art

A switched capacitor circuit is used for a sample hold circuit, an integrator, a switched capacitor filter, and the like. The switched capacitor circuit includes a combination of a capacitor and a complementary metal-oxide semiconductor (CMOS) switch (also referred to as an analog switch or a transfer gate).

FIG. 1A and FIG. 1B are circuit diagrams illustrating a basic configuration of a switched capacitor circuit. A switched capacitor circuit 10r is a sample hold circuit, and includes a hold capacitor $C_{OUT}$ and a CMOS switch SW1. An input voltage $V_{IN}$ is applied to one end of the CMOS switch SW1, and the other end thereof is connected to the capacitor $C_{OUT}$. When the CMOS switch SW1 is turned on, the capacitor $C_{OUT}$ is charged with the input voltage $V_{IN}$ (sample), and the input voltage $V_{IN}$ is held even after the CMOS switch SW1 is turned off (hold).

As illustrated in FIG. 1B, the CMOS switch SW1 includes an N-channel metal-oxide semiconductor (NMOS) transistor and a P-channel metal-oxide semiconductor (PMOS) transistor connected in parallel.

When a drive circuit 20r makes a clock CK a high level and a complementary clock CKB a low level, the CMOS switch SW1 becomes conductive.

As illustrated in FIG. 1B, the NMOS transistor has parasitic capacitances $C_{NS}$, $C_{ND}$, and $C_{NB}$ between a gate and a source, between the gate and a drain, and between the gate and a substrate (back gate). Similarly, the PMOS transistor has parasitic capacitances $C_{PS}$, $C_{PD}$, and $C_{PB}$ between a gate and a source, between the gate and a drain, and between the gate and a substrate.

FIG. 2 is an operation waveform diagram of the switched capacitor circuit 10r of FIG. 1A and FIG. 1B. When the clock CK is shifted to the high level and the complementary clock CKB is shifted to the low level at time t0, the CMOS switch SW1 is turned on. As a result, the capacitor $C_{OUT}$ is charged with the input voltage $V_{IN}$, and an output voltage $V_{OUT}$ approaches the input voltage $V_{IN}$. Subsequently, when the clock CK is shifted to the low level and the complementary clock CKB is shifted to the high level at time t1, the CMOS switch SW1 is turned off. At this time, an error $\Delta V_{OUT}$ is generated between the output voltage $V_{OUT}$ and the input voltage $V_{IN}$ due to clock feed-through and charge injection caused by the parasitic capacitances.

The clock feed-through is a phenomenon in which a high frequency component included in an edge of a gate signal (clock signal) of a metal-oxide semiconductor (MOS) transistor propagates to an output node via gate-drain capacitances $C_{PD}$ and $C_{ND}$ at a timing of turning off a MOS transistor. Specifically, when the PMOS transistor is turned off, the PMOS transistor increases the output voltage $V_{OUT}$ by $\Delta V_1$.

$$\Delta V_1 = C_{PD}/(C_{OUT}+C_{PD}) \times V_{DD} \quad (1)$$

Further, when the NMOS transistor is turned off, the NMOS transistor decreases the output voltage $V_{OUT}$ by $\Delta V_2$.

$$\Delta V_2 = C_{ND}/(C_{OUT}+C_{ND}) \times V_{DD} \quad (2)$$

In addition, the charge injection is a phenomenon in which charges accumulated while a MOS transistor is in an on state in a gate-substrate (back gate) capacitance $C_{PB}$ of the MOS transistor affect an output voltage $V_{OUT}$ when the MOS transistor is turned off.

While the PMOS transistor is in an on state, charges $Q_P \approx C_{PB} \times (V_{DD} - V_{TP})$ are stored between the gate and the substrate. $V_{TP}$ is a threshold voltage. When the PMOS transistor is turned off, a part of the charges $Q_P$, which is represented by $\alpha_P \times Q_P$ ($\alpha_P$ denotes a coefficient), moves to the capacitor $C_{OUT}$ and as a result, the output voltage $V_{OUT}$ is increased by $\Delta V_3$.

$$\Delta V_3 = \alpha_P \times Q_P/C_{OUT} = \alpha_P \times C_{PB} \times (V_{DD}-V_{TP})/C_{OUT} \quad (3)$$

A phenomenon reverse to the above phenomenon occurs in the NMOS transistor, and as a result, the output voltage $V_{OUT}$ is decreased by $\Delta V_4$.

$$\Delta V_4 = \alpha_N \times Q_N/C_{OUT} = \alpha_N \times C_{NB} \times (V_{DD}-V_{TN})/C_{OUT} \quad (4)$$

The error $\Delta V_{OUT}$ between the output voltage $V_{OUT}$ and the input voltage $V_{IN}$ illustrated in FIG. 2 is the sum of $\Delta V_1$ to $\Delta V_4$. As is apparent from the expressions (1) and (2), an influence of the clock feed-through can be reduced by reducing the gate-drain capacitances $C_{PD}$ and $C_{ND}$. Accordingly, the influence can be reduced by reducing a gate width W.

Further, as can be seen from the expressions (3) and (4), an influence of the charge injection can be reduced by reducing the gate-substrate capacitances $C_{PB}$ and $C_{NB}$. Accordingly, the influence can be reduced by reducing the gate width W and a gate length L.

As a result of investigation on the CMOS switch, the present inventors have recognized the following problems.

The clocks CK and CKB input to the gates of the NMOS transistor and the PMOS transistor are generated by setting a power supply voltage $V_{DD}$ as the high level and a ground voltage $V_{SS}$ (0 V) as the low level. Therefore, fluctuation of the power supply voltage $V_{DD}$ is fluctuation of gate voltages of the NMOS transistor and the PMOS transistor.

As described above, in order to reduce the clock feed-through and the charge injection, it is necessary to minimize sizes of the NMOS transistor and the PMOS transistor. When the NMOS transistor and the PMOS transistor of the same size are compared, the NMOS transistor has higher driving capability (smaller on-resistance) due to difference in mobility therebetween. Further, the on-resistances of the NMOS transistor and the PMOS transistor depend on the gate voltage, that is, the power supply voltage $V_{DD}$.

FIG. 3 is a diagram illustrating an on-resistance of a CMOS switch in related art, in which the sizes of the NMOS transistor and the PMOS transistor are minimized. A horizontal axis represents an input voltage and a vertical axis represents the on-resistance. As can be seen from FIG. 3, an on-resistance $R_{ON}$ when the power supply voltage $V_{DD}$ is 2.8 V is twice or more an on-resistance $R_{ON}$ when the power supply voltage $V_{DD}$ is 5 V. It is desirable that fluctuation of the on-resistance $R_{ON}$ is small since the on-resistance $R_{ON}$ affects a charging speed of the capacitor $C_{OUT}$ and thus an operation speed of the circuit in the sample hold circuit of FIG. 1A.

SUMMARY OF THE INVENTION

The present invention has been made in view of the above problems, and one of exemplary purposes of one embodiment of the present invention is to provide a sample hold circuit with reduced power supply voltage dependency of an on-resistance.

One embodiment of the present invention relates to a sample hold circuit. The sample hold circuit includes at least one capacitor and at least one CMOS switch. Each of the at least one CMOS switch includes an NMOS transistor and a PMOS transistor connected in parallel. A high level of a gate signal of the NMOS transistor is adjusted to a voltage level lower than a power supply voltage of a chip on which the CMOS switch is integrated.

Another embodiment of the present invention also relates to a sample hold circuit. The sample hold circuit includes at least one capacitor and at least one CMOS switch. Each of the at least one CMOS switch includes an NMOS transistor and a PMOS transistor connected in parallel. A high level of a gate signal of the NMOS transistor is lower than a high level of a gate signal of the PMOS transistor.

Still another embodiment of the present invention relates to a semiconductor device. The semiconductor device includes a CMOS switch including an NMOS transistor and a PMOS transistor connected in parallel, and a gate voltage adjustment circuit structured to adjust a high level of a gate signal of an NMOS transistor to a voltage level lower than a power supply voltage of a chip on which the CMOS switch is integrated.

It is to be noted that any arbitrary combination or rearrangement of the above-described structural components and so forth is effective as and encompassed by the present embodiments. Moreover, this summary of the invention does not necessarily describe all necessary features so that the invention may also be a sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

Figure 1A:
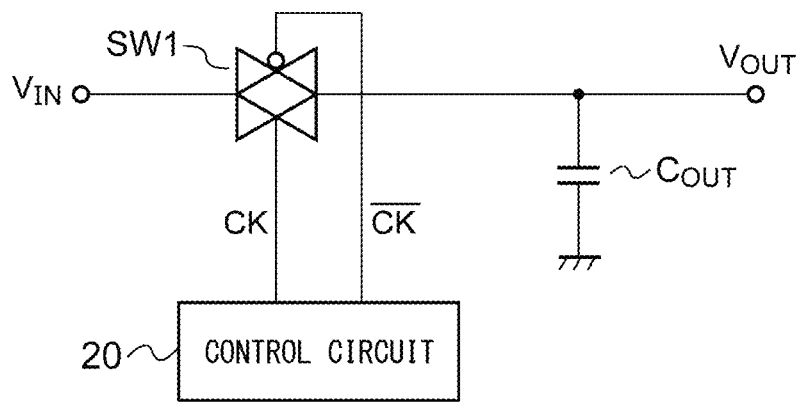
FIG. 1A and FIG. 1B are circuit diagrams illustrating a basic configuration of a switched capacitor circuit.
Figure 1B:
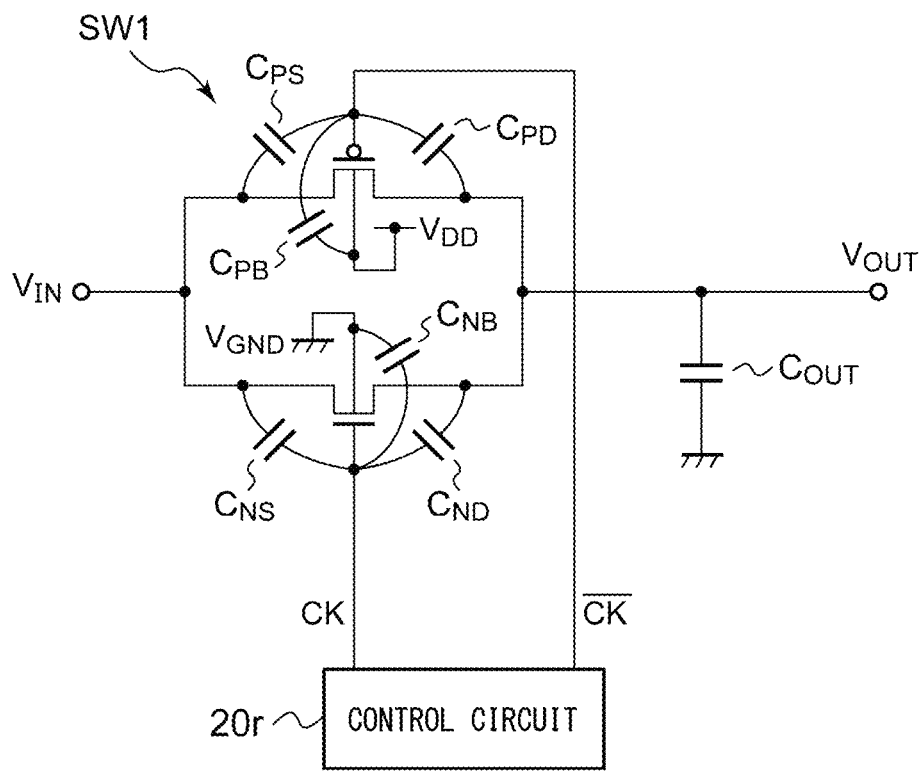
Figure 2:
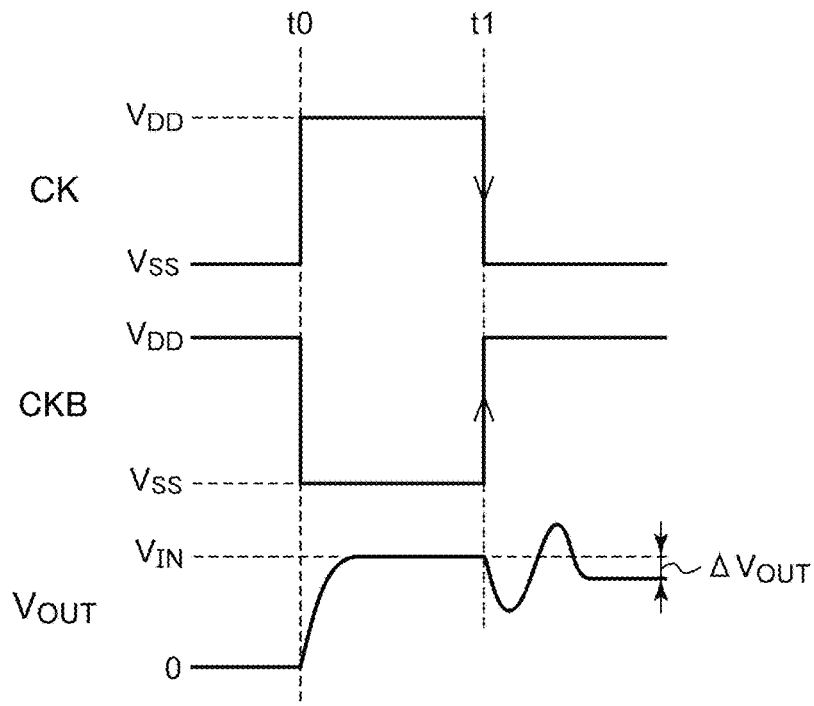
FIG. 2 is an operation waveform diagram of the switched capacitor circuit of FIG. 1A and FIG. 1B.

The invention will now be described based on preferred embodiments which do not intend to limit the scope of the present invention but exemplify the invention. All of the features and the combinations thereof described in the embodiment are not necessarily essential to the invention.

Outline of Embodiments

1. One embodiment disclosed in the present specification relates to a sample hold circuit. The sample hold circuit includes at least one capacitor and at least one CMOS switch. Each of the at least one CMOS switch includes an NMOS transistor and a PMOS transistor connected in parallel. A high level of a gate signal of the NMOS transistor is adjusted to a voltage level lower than a power supply voltage of a chip on which the CMOS switch is integrated.

According to this embodiment, an on-resistance of the NMOS transistor is higher as compared with a case where a high voltage of a gate of the NMOS transistor is set as the power supply voltage. With this arrangement, power supply voltage dependency of the on-resistance of the CMOS switch as a whole can be reduced.

The at least one CMOS switch may be plural. The sample hold circuit may further include a voltage source that generates a predetermined internal voltage lower than the power supply voltage, and a plurality of inverters. Each of the plurality of inverters may further include an input terminal that receives a gate signal of a corresponding PMOS transistor, a power supply terminal that receives the internal voltage, and an output terminal connected to a gate of a corresponding NMOS transistor.

The voltage source may include a dummy switch disposed close to the CMOS switch and may be structured to adjust the internal voltage in accordance with an on-resistance of the dummy switch. With this arrangement, the power supply voltage of the on-resistance can be further reduced.

Viewed from another viewpoint, the sample hold circuit according to one embodiment has the following features. The sample hold circuit includes at least one capacitor and at least one CMOS switch. Each of the at least one CMOS switch includes an NMOS transistor and a PMOS transistor connected in parallel. A high level of a gate signal of the NMOS transistor is lower than a high level of a gate signal of the PMOS transistor.

The high level of the gate signal of the PMOS transistor may be a power supply voltage of a chip on which the CMOS switch is integrated, and the high level of the gate signal of the NMOS transistor may be a predetermined voltage lower than the power supply voltage of the chip on which the CMOS switch is integrated.

2. One embodiment disclosed in the present specification relates to a CMOS switch. The CMOS switch includes an NMOS transistor and a PMOS transistor connected in parallel. The NMOS transistor and the PMOS transistor are disposed adjacent to each other on a semiconductor substrate in a first direction. Wirings are drawn out from a drain and a source of each of the NMOS transistor and the PMOS transistor in a second direction orthogonal to the first direction. Gates of the NMOS transistor and the PMOS transistor are extended in a direction opposite to the second direction so as to have a dimension longer than a channel width, and gate lines are drawn out from ends of the gates of the NMOS transistor and the PMOS transistor in the direction opposite to the second direction.

According to this embodiment, by extending the gates so as to be wider than the channel width, a distance between the gate line and a drain/source wiring drawn out from the drain (source) can be increased and an inter-wire capacitance therebetween can be reduced, and crosstalk can be suppressed.

Further, by forming a shield line between the gate line and the drain/source wiring in a direction orthogonal to the gate line and the drain/source wiring and generating a parasitic capacitance between the drain/source wiring and the shield line, coupling between the drain/source wiring and the gate line is weakened and the crosstalk can be further reduced.

In addition, because of symmetry of the drain and the source, the parasitic capacitance between the drain wiring and the shield line and the parasitic capacitance between the source wiring and the shield line become substantially equal, and imbalance in the parasitic capacitance is also eliminated.

The shield line is preferably a low impedance line. For example, the shield line may be grounded. Alternatively, the shield line may be a power supply line to which a bypass capacitor having a large capacitance is connected.

The shield line may be a multilayer wiring. The crosstalk between a clock line and the drain/source wiring can be further reduced by multilaying the shield line.

In one embodiment, the CMOS switch can be used for the sample hold circuit.

Hereinbelow, the present invention will be described with reference to drawings based on preferred embodiments. Identical or equivalent structural components, members, and processes illustrated in the respective drawings are denoted by the same reference numerals, and duplicate description thereof will be omitted as appropriate. Further, the embodiments are not limitations of the invention but examples, and all the features described in the embodiment and combinations thereof are not necessarily essential to the invention.

In the present specification, "a state where a member A is connected to a member B" also includes a case where the members A and B are connected indirectly via another member which does not substantially affect an electrical connection state of the members A and B or which does not impair a function or an effect exerted by coupling between the members A and B, in addition to a case where the members A and B are physically and directly connected.

Similarly, "a state where a member C is provided between the members A and B" also includes a case where the members A and C or the members B and C are connected indirectly via another member which does not substantially affect an electrical connection state of the members A and C or the members B and C or which does not impair a function or an effect exerted by coupling between the members A and C or the members B and C, in addition to a case where the members A and C or the members B and C are directly connected.

Figure 4:
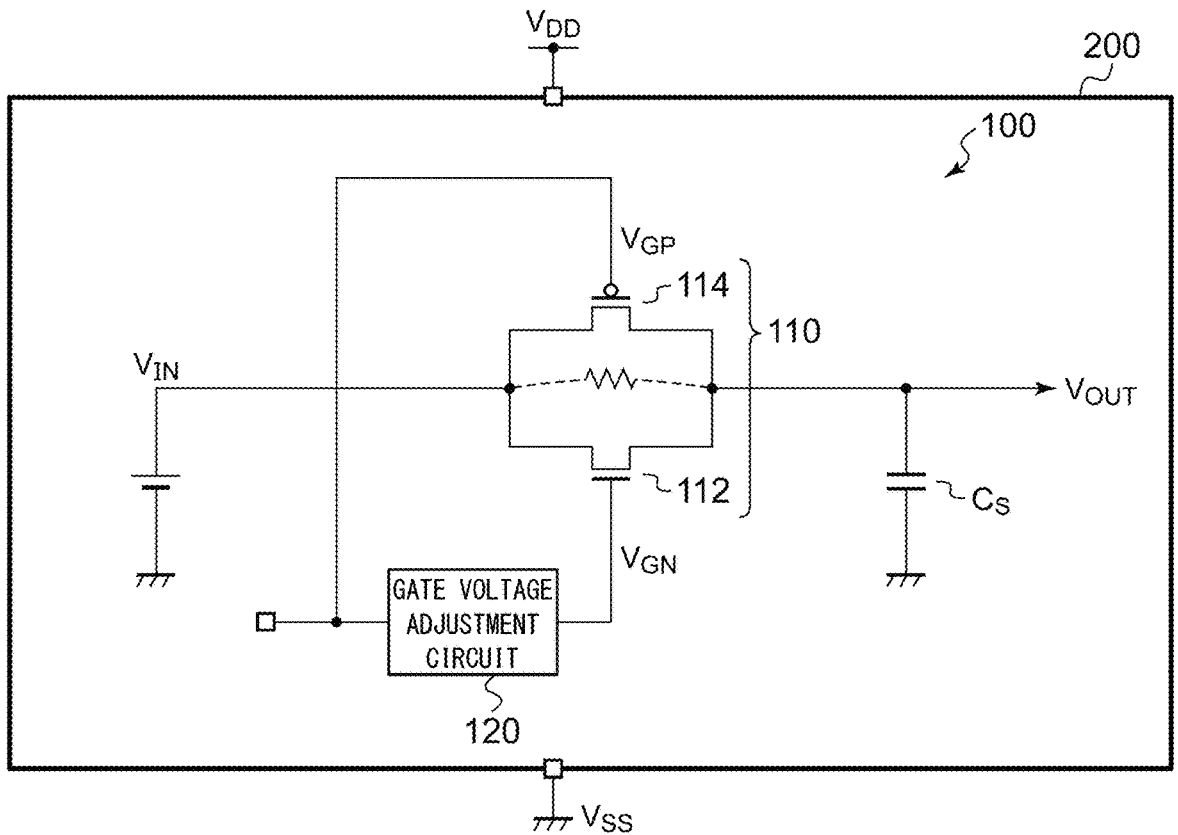
FIG. 4 is a circuit diagram illustrating a basic configuration of a sample hold circuit according to an embodiment.

FIG. 4 is a circuit diagram illustrating a basic configuration of a sample hold circuit 100 according to the embodiment. The sample hold circuit 100 includes at least one capacitor $C_S$ and at least one CMOS switch 110. The sample hold circuit illustrated in FIG. 4 has a most simplified structure including one capacitor $C_S$ and one CMOS switch 110. The sample hold circuit 100 is integrated in a semiconductor chip 200. A package obtained by packaging the semiconductor chip 200 is referred to as a semiconductor device.

Each CMOS switch 110 includes an NMOS transistor 112 and a PMOS transistor 114 connected in parallel.

A high level of a gate signal $V_{GN}$ of the NMOS transistor 112 is adjusted to a predetermined voltage level $V_{REG}$ lower than a power supply voltage $V_{DD}$ of the semiconductor chip 200 in which the CMOS switch 110 is integrated. Note that the power supply voltage $V_{DD}$ of the semiconductor chip 200 is assumed to fluctuate, and the power supply voltage $V_{DD}$ here may be a rated voltage or a maximum voltage thereof, for example.

$$V_{REG} < V_{DD}$$

A low level of the gate signal $V_{GN}$ of the NMOS transistor 112 is a ground voltage $V_{SS}$. On the other hand, a high level of a gate signal $V_{GP}$ of the PMOS transistor 114 is the power supply voltage $V_{DD}$, and a low level thereof is the ground voltage $V_{SS}$.

A gate voltage adjustment circuit 120 lowers the high level of the gate signal $V_{GN}$ of the NMOS transistor 112 to the predetermined voltage $V_{REG}$. The gate signal of the NMOS transistor 112 is a complementary signal of the gate signal of the PMOS transistor 114. For example, a clock CK switching between the voltages $V_{DD}$ and $V_{SS}$ is input to a gate of the PMOS transistor 114. The gate voltage adjustment circuit 120 logically inverts the clock CK input to the gate of the PMOS transistor 114 and lowers the high level of the clock CK from the power supply voltage $V_{DD}$ to an internal voltage $V_{REG}$.

Figure 5:
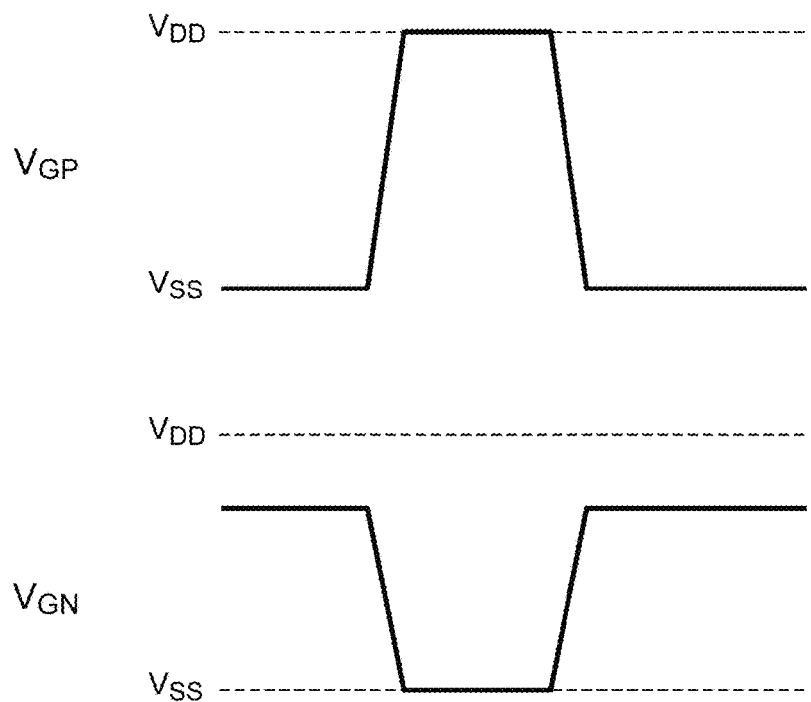
FIG. 5 is an operation waveform diagram of the sample hold circuit of FIG. 4.

The above is the configuration of the sample hold circuit 100. Next, an operation of the sample hold circuit 100 will be described. FIG. 5 is an operation waveform diagram of the sample hold circuit 100 of FIG. 4.

Figure 6:
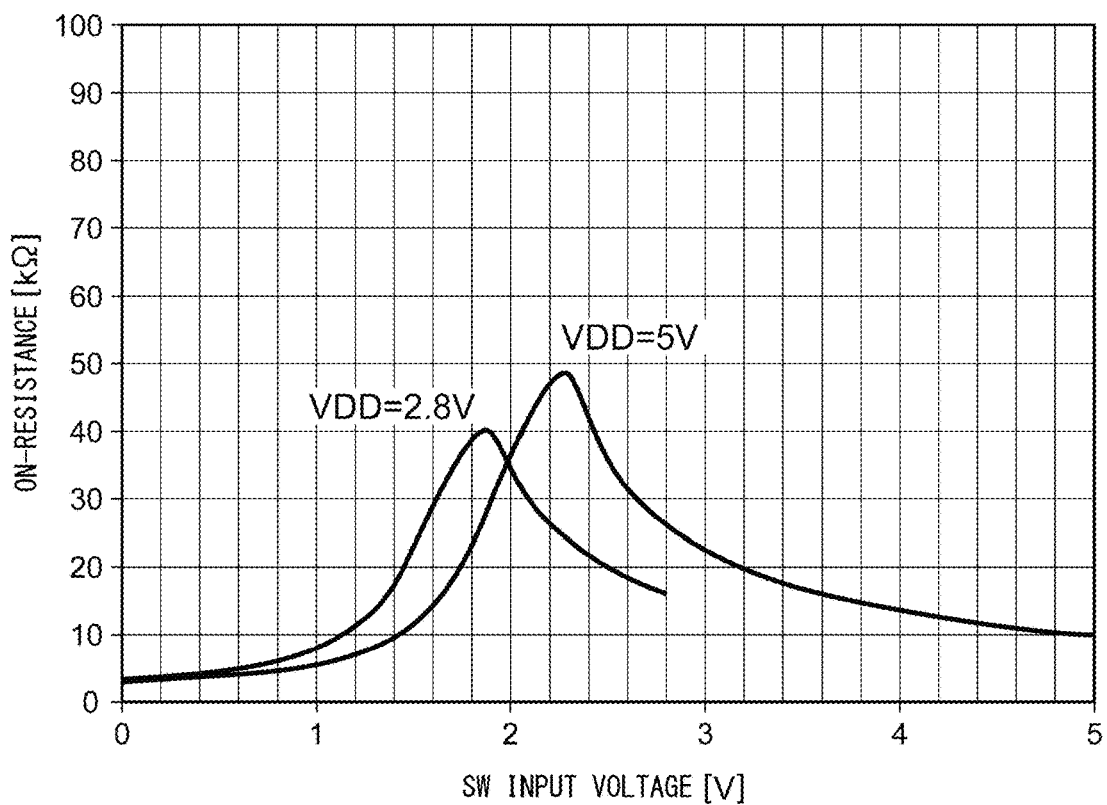
FIG. 6 is a diagram illustrating an on-resistance of a CMOS switch of FIG. 4.

FIG. 6 is a diagram illustrating an on-resistance of the CMOS switch 110 of FIG. 4. Here, characteristics when $V_{REG}$=3 V and $V_{DD}$=5 V and 2.8 V are illustrated.

When the power supply voltage $V_{DD}$ is 5 V, the high level of the gate signal of the NMOS transistor 112 is $V_{REG}$=3 V. Therefore, an on-resistance of the NMOS transistor 112 is increased as compared with a case where the high level of the gate signal is $V_{DD}$=5 V. Since an on-resistance $R_{ON}$ of the CMOS switch is a combined resistance of the on-resistance of the NMOS transistor 112 and an on-resistance of the PMOS transistor 114, the on-resistance $R_{ON}$ of the CMOS switch is increased by the increase of the on-resistance of the NMOS transistor 112.

Figure 3:
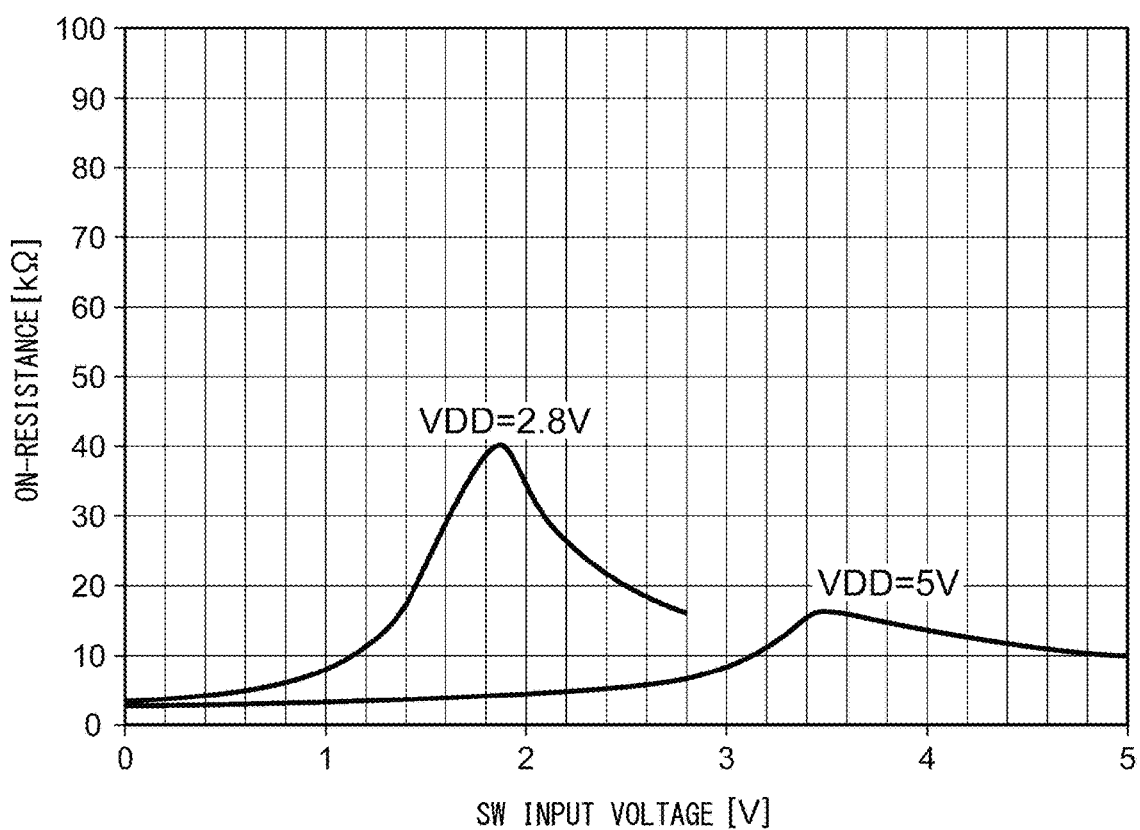
FIG. 3 is a diagram illustrating an on-resistance of a CMOS switch in related art, in which sizes of an NMOS transistor and a PMOS transistor are minimized.

In FIG. 3, the on-resistance $R_{ON}$ when $V_{DD}$=5 V is lower than that when $V_{DD}$=2.8 V. However, the magnitude relation of the on-resistance $R_{ON}$ is reversed in FIG. 6. Further, an input voltage level at which the on-resistance $R_{ON}$ of the CMOS switch becomes a peak is $V_{IN}$=3.4 V or so in FIG. 3. However, it is decreased to $V_{IN}$=2.3 V in FIG. 6.

On the other hand, in a state where the power supply voltage $V_{DD}$ is decreased to 2.8 V, the high level of the gate signal of the NMOS transistor 112 is hardly maintained at $V_{REG}$=3 V and becomes 2.8 V, and therefore, the on-resistance of the CMOS switch is substantially the same as that in FIG. 3.

In FIG. 3, the peak of the on-resistance $R_{ON}$ is 16 kΩ when $V_{DD}$=5 V and 40 kΩ when $V_{DD}$=2.8 V. In FIG. 6, the peak of the on-resistance $R_{ON}$ is 48 kΩ when $V_{DD}$=5 V and 40 kΩ when $V_{DD}$=2.8 V, and a fluctuation width or a fluctuation amount of the peak is remarkably small as compared with FIG. 3.

As described above, according to the sample hold circuit 100 according to the embodiment, dependency on the power supply voltage $V_{DD}$ of the on-resistance of the CMOS switch can be reduced.

The present invention extends to various devices and circuits which are grasped as the block diagram and the circuit diagram of FIG. 4 or derived from the above description, and is not limited to a specific configuration. Hereinbelow, more specific configuration examples and modifications will be described in order to help understanding of an essence of the invention and a circuit operation and to clarify them, rather than to narrow the scope of the present invention.

Figure 7:
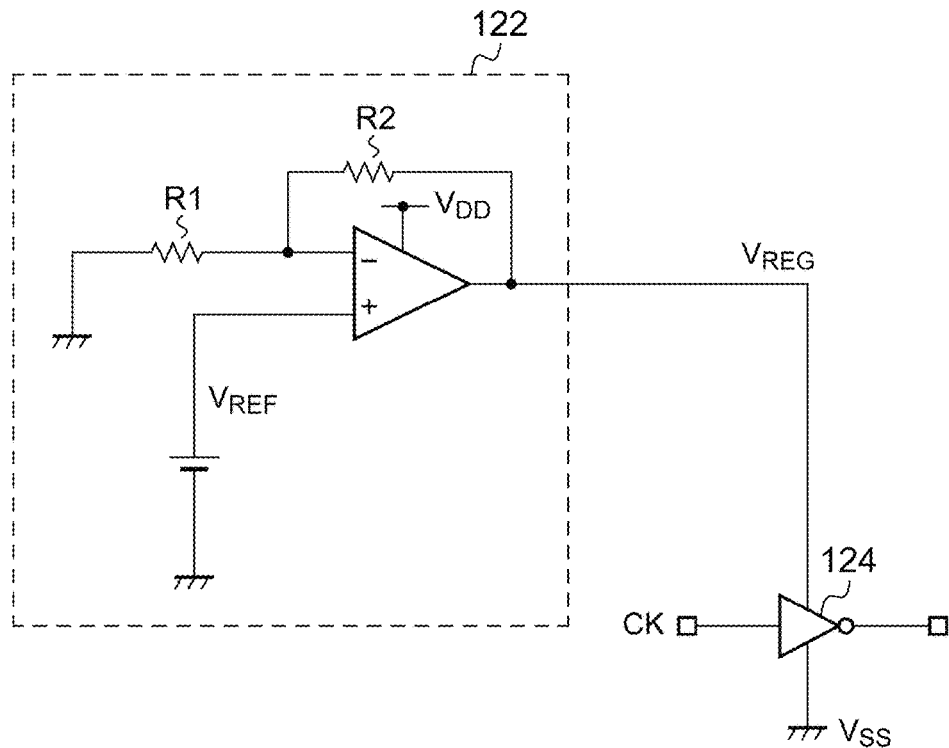
FIG. 7 is a circuit diagram of a configuration example of a gate voltage adjustment circuit.

FIG. 7 is a circuit diagram of a configuration example of the gate voltage adjustment circuit 120. The gate voltage adjustment circuit 120 includes a voltage source 122 and an inverter 124. Although a configuration of the voltage source 122 is not particularly limited, a non-inverting amplifier is exemplified here, and the internal voltage $V_{REG}$=$V_{REF}$× (R1+R2)/R1. The internal voltage $V_{REG}$ is supplied to an upper power supply terminal of the inverter 124 and the ground voltage $V_{SS}$ is supplied to a lower power supply terminal. The inverter 124 inverts the clock CK supplied to the gate of the PMOS transistor 114 and supplies the inverted clock CK to a gate of the NMOS transistor 112. An output of the inverter 124 is an inversion signal CK# of the clock CK, and a high level thereof is $V_{REG}$ and a low level thereof is $V_{SS}$.

Figure 8A:
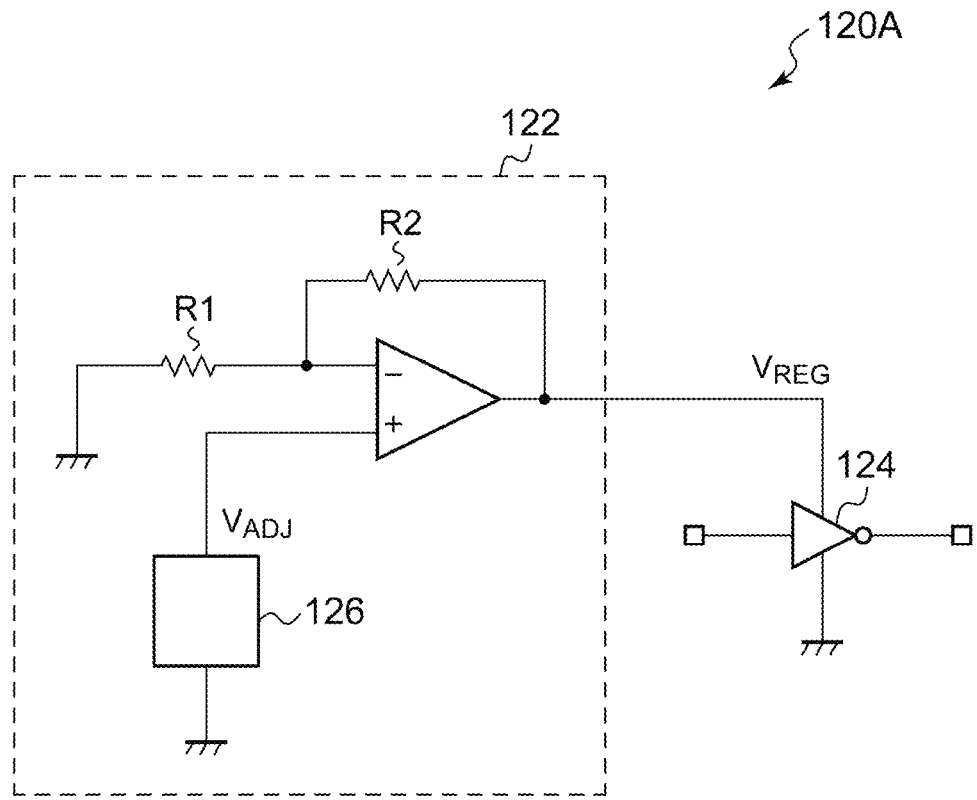
FIG. 8A and FIG. 8B are circuit diagrams of a gate voltage adjustment circuit according to a modification.
Figure 8B:
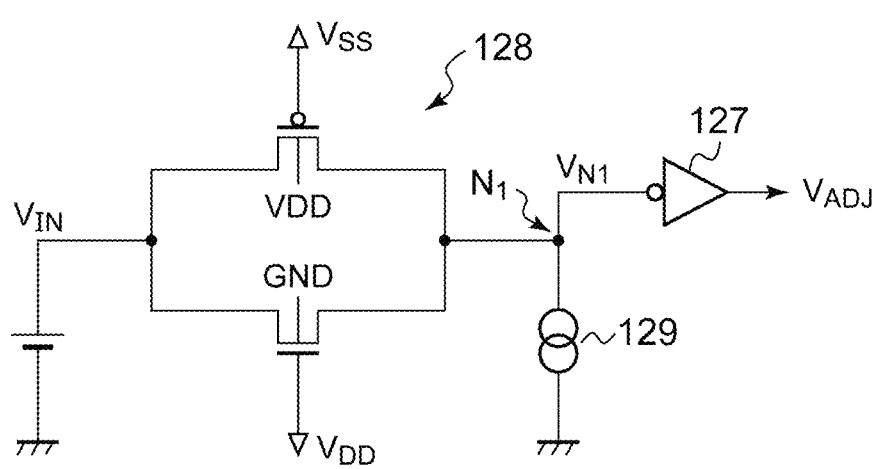

FIG. 8A and FIG. 8B are circuit diagrams of a gate voltage adjustment circuit 120A according to a modification. The gate voltage adjustment circuit 120A in FIG. 8A includes a variable voltage source 126. The variable voltage source 126 adjusts a reference voltage $V_{ADJ}$ so that an on-resistance of a CMOS switch becomes constant. FIG. 8B is a circuit diagram illustrating a configuration example of the variable voltage source 126. The variable voltage source 126 includes a dummy switch 128. The dummy switch 128 is a replica of the CMOS switch 110, and is disposed close to the CMOS switch 110. In the dummy switch 128, a high voltage $V_H$ (for example, a power supply voltage $V_{DD}$) is supplied to a gate of an NMOS transistor, and a low voltage $V_L$ (for example, a ground voltage $V_{SS}$) is supplied to a gate of a PMOS transistor.

The dummy switch 128 is connected to a dummy load 129. The variable voltage source 126 outputs the reference voltage $V_{ADJ}$ having a positive correlation with an on-resistance of the dummy switch 128. For example, the reference voltage $V_{ADJ}$ may by generated by inverting and amplifying a voltage $V_{N1}$ of an output node $N_1$ of the dummy switch 128 by an inverting amplifier 127. When the on-resistance of the CMOS switch 110 fluctuates due to fluctuations in the power supply voltage $V_{DD}$, process variation, temperature fluctuations, or the like, the on-resistance of the dummy switch 128 fluctuates accordingly, and the reference voltage $V_{ADJ}$ is adjusted. For example, by increase of the on-resistance of the CMOS switch 110, the on-resistance of the dummy switch 128 increases, and the reference voltage $V_{ADJ}$ becomes high. As a result, an internal voltage $V_{REG}$ becomes high, and the on-resistance of the CMOS switch 110 decreases. In contrast, by decrease of the on-resistance of the CMOS switch 110, the on-resistance of the dummy switch 128 decreases and the reference voltage $V_{ADJ}$ becomes low. As a result, the internal voltage $V_{REG}$ becomes low, and the on-resistance of the CMOS switch 110 increases.

In this way, by monitoring the on-resistance of the CMOS switch 110 using the dummy switch, it is possible to reduce an influence of process variation, fluctuations in a power supply voltage, temperature fluctuations, or the like, and to stabilize the on-resistance of the CMOS switch 110.

Figure 9:
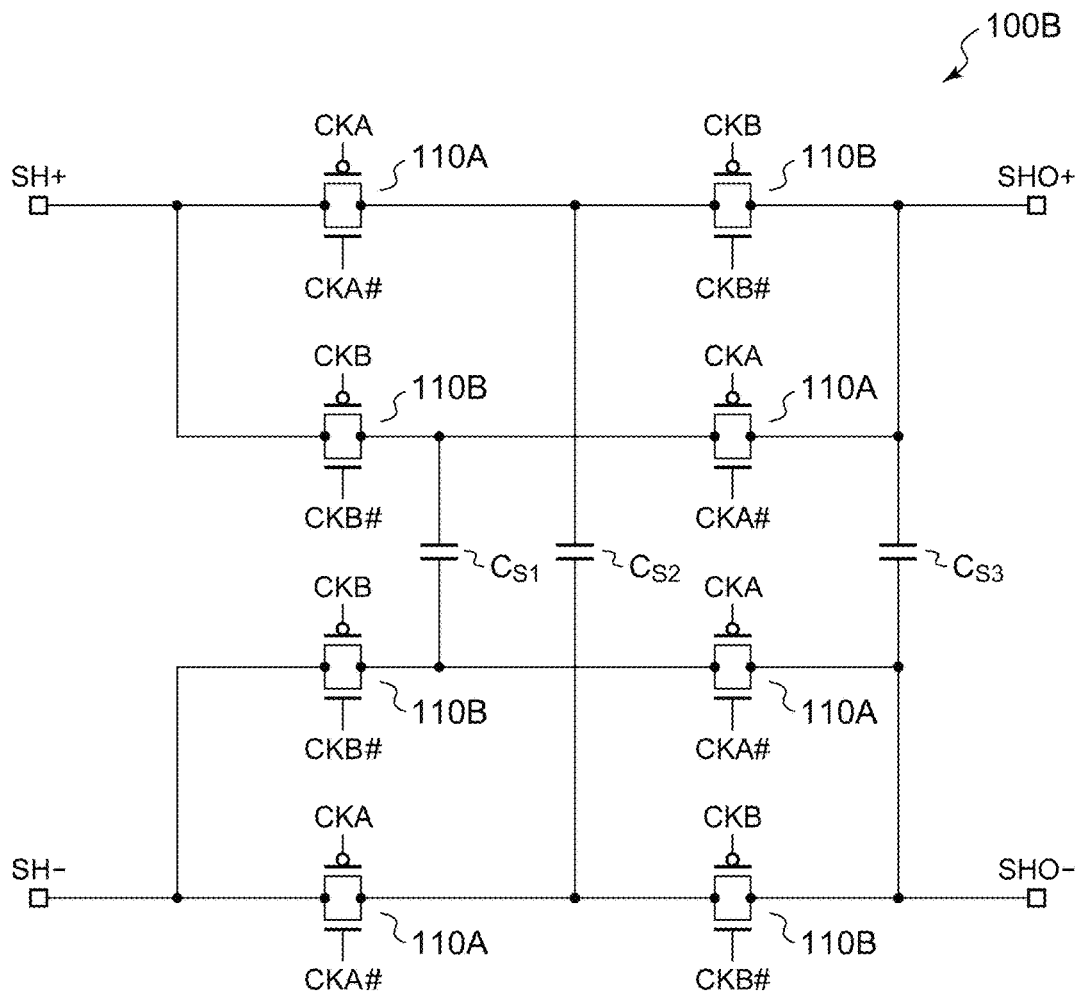
FIG. 9 is a circuit diagram of a sample hold circuit in a differential form.
Figure 9:
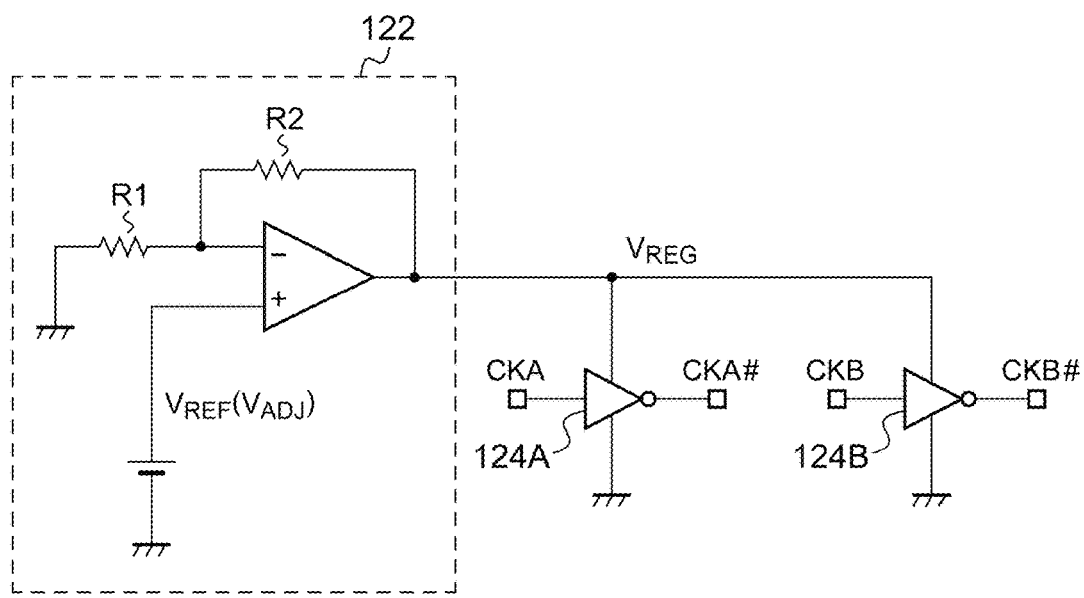

FIG. 9 is a circuit diagram of a sample hold circuit 100B in a differential form. The sample hold circuit 100B includes a plurality of CMOS switches 110A and 110B and a plurality of capacitors $C_{S1}$ to $C_{S3}$. The plurality of CMOS switches 110A is controlled in accordance with A-phase clocks CKA, and the plurality of CMOS switches 110B is controlled in accordance with B-phase clocks CKB. The A-phase clock CKA and the B-phase clock CKB are in opposite phases.

A plurality of inverters 124A and 124B corresponds to the plurality of CMOS switches 110A and 110B. The inverter 124A receives a gate signal CKA of a PMOS transistor 114 of a corresponding CMOS switch 110A at an input terminal of the inverter 124A. An internal voltage $V_{REG}$ is supplied to a power supply terminal of the inverter 124A, and an output thereof is connected to the gate of an NMOS transistor 112 of the corresponding CMOS switch 110A. The inverter 124B receives a gate signal CKB of a PMOS transistor 114 of a corresponding CMOS switch 110B at an input terminal of the inverter 124B. The internal voltage $V_{REG}$ is supplied to a power supply terminal of the inverter 124B, and an output thereof is connected to the gate of an NMOS transistor 112 of the corresponding CMOS switch 110B.

One inverter 124A may be provided in common for all the CMOS switches 110A, or one inverter 124A may be provided for each CMOS switch 110A. The same applies to the inverter 124B. One inverter 124B may be provided in common for all the CMOS switches 110B, or one inverter 124B may be provided for each CMOS switch 110B.

Figure 10:
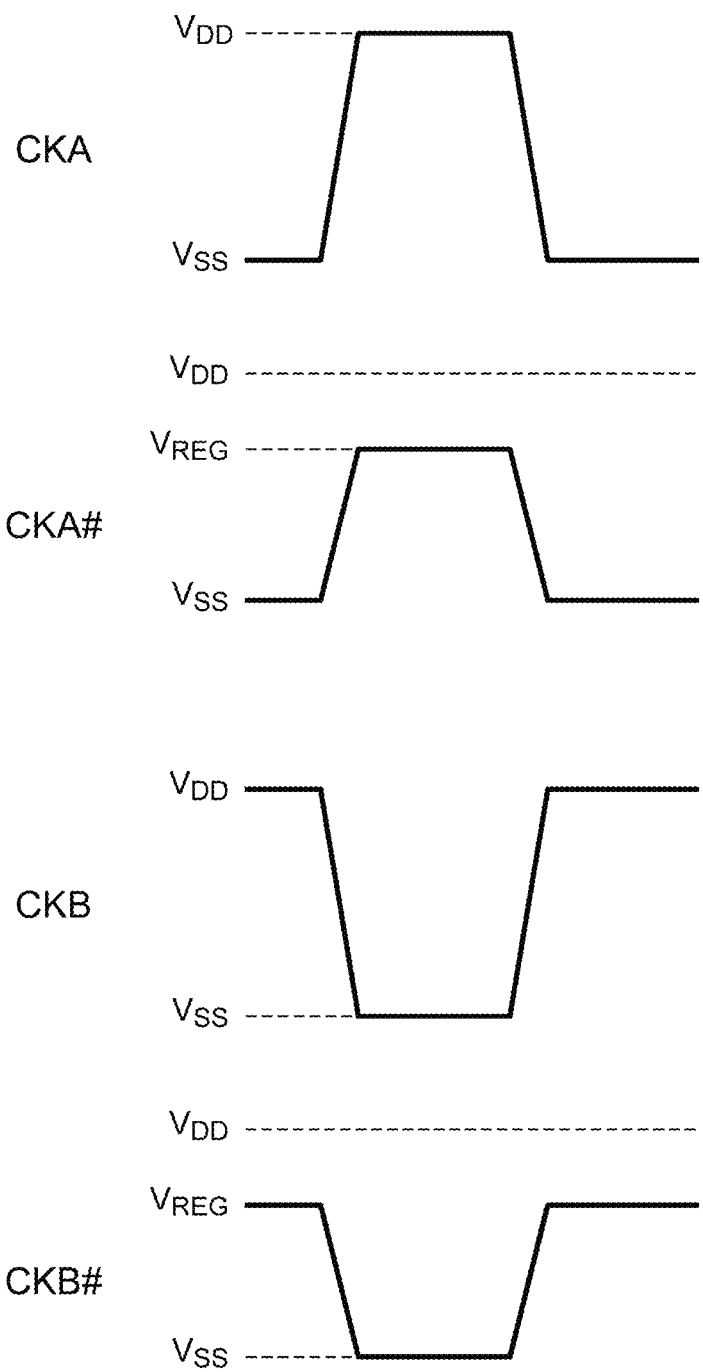
FIG. 10 is an operation waveform diagram of the sample hold circuit of FIG. 9.

FIG. 10 is an operation waveform diagram of the sample hold circuit 100B of FIG. 9. According to the sample hold circuit 100B of FIG. 9, power supply voltage dependency of an on-resistance of the CMOS switch can be reduced.

Figure 11A:
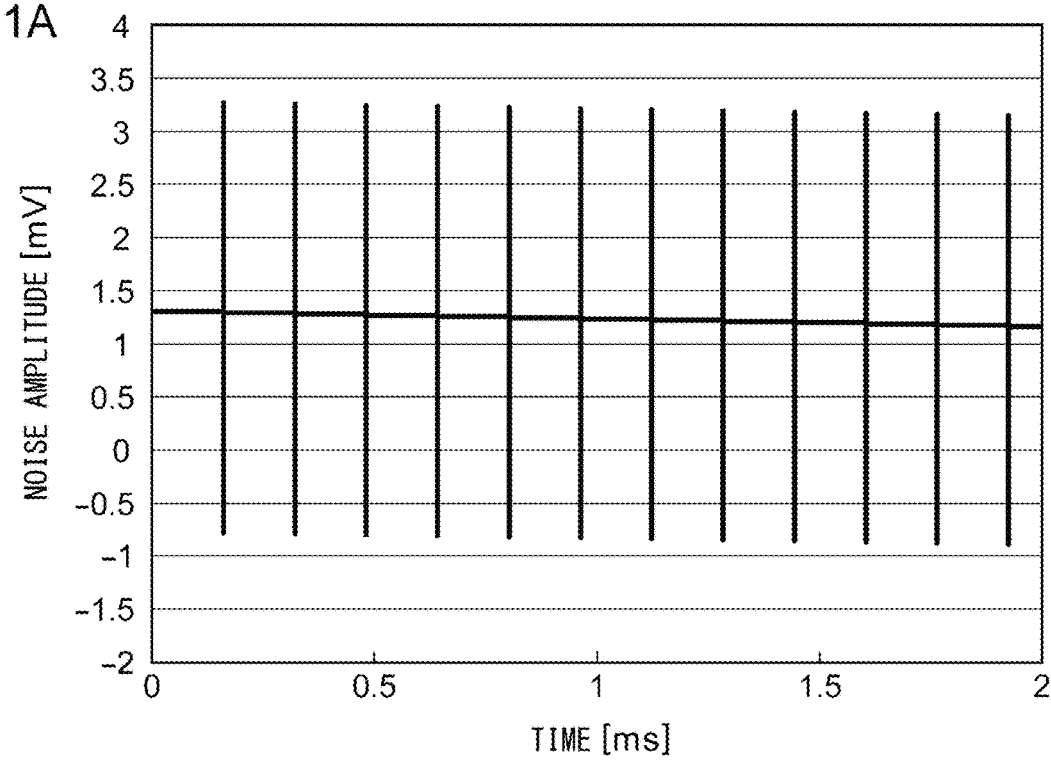
FIG. 11A is a waveform diagram illustrating noise characteristics of the sample hold circuit of FIG. 9.
Figure 11B:
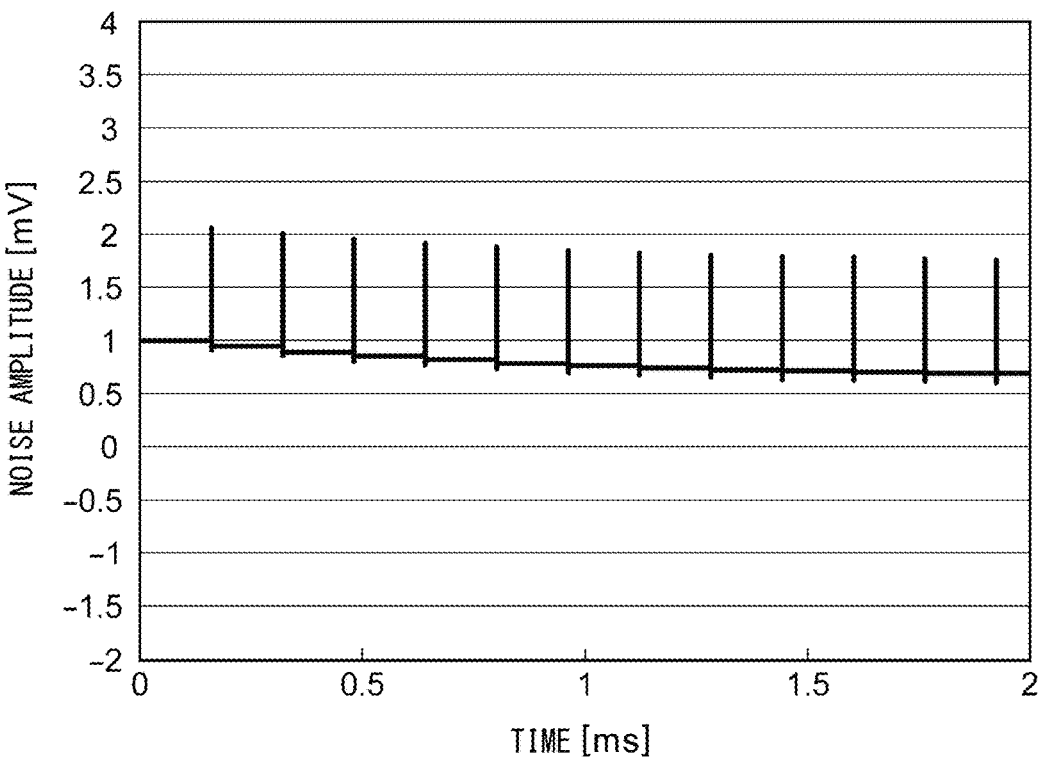
FIG. 11B is a waveform diagram illustrating noise characteristics of a sample hold circuit in related art.

In addition, noise characteristics can also be improved in the sample hold circuit 100B of FIG. 9. FIG. 11A is a waveform diagram illustrating the noise characteristics of the sample hold circuit of FIG. 9. In addition, FIG. 11B illustrates noise characteristics of a circuit in which a sample hold circuit in related art is configured in a differential form. Note that output voltages in FIG. 11A and FIG. 11B indicate differential components (SHO$_+$_SHO$_-$). As is apparent from comparison between FIG. 11A and FIG. 11B, according to the sample hold circuit 100B of FIG. 9, amplitude of a switching noise can be greatly reduced.

Next, a layout of the CMOS switch will be described.

Figure 12:
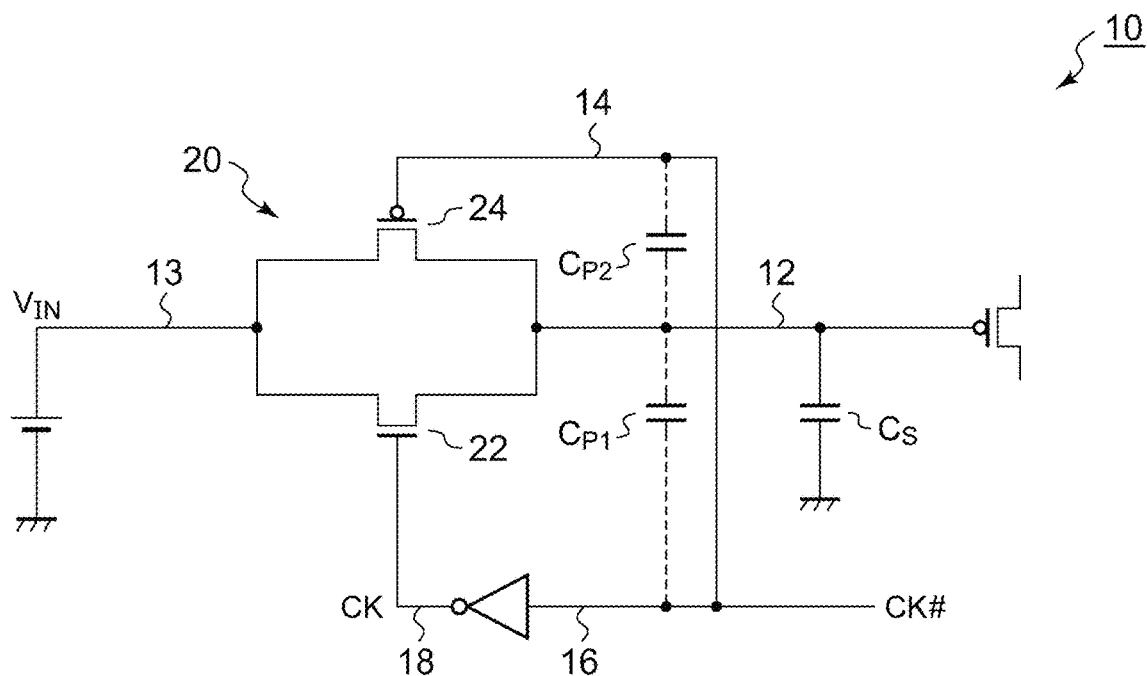
FIG. 12 is a circuit diagram of a sample hold circuit including a CMOS switch.

FIG. 12 is a circuit diagram of a sample hold circuit 10 including a CMOS switch 20. The sample hold circuit 10 includes the CMOS switch 20 and a capacitor $C_S$. An input voltage $V_{IN}$ is applied to one end of the CMOS switch 20, and the other end is connected to a high impedance line 12. The high impedance line 12 is connected to the capacitor $C_S$. When the CMOS switch 20 is turned on, the capacitor $C_S$ is charged with the input voltage $V_{IN}$ (sample), and the input voltage $V_{IN}$ is held even after the CMOS switch 20 is turned off (hold).

The CMOS switch 20 includes an NMOS transistor and a PMOS transistor connected in parallel. Complementary clocks CK and CK# are input to a gate of an NMOS transistor 22 and a gate of a PMOS transistor 24.

Figure 13:
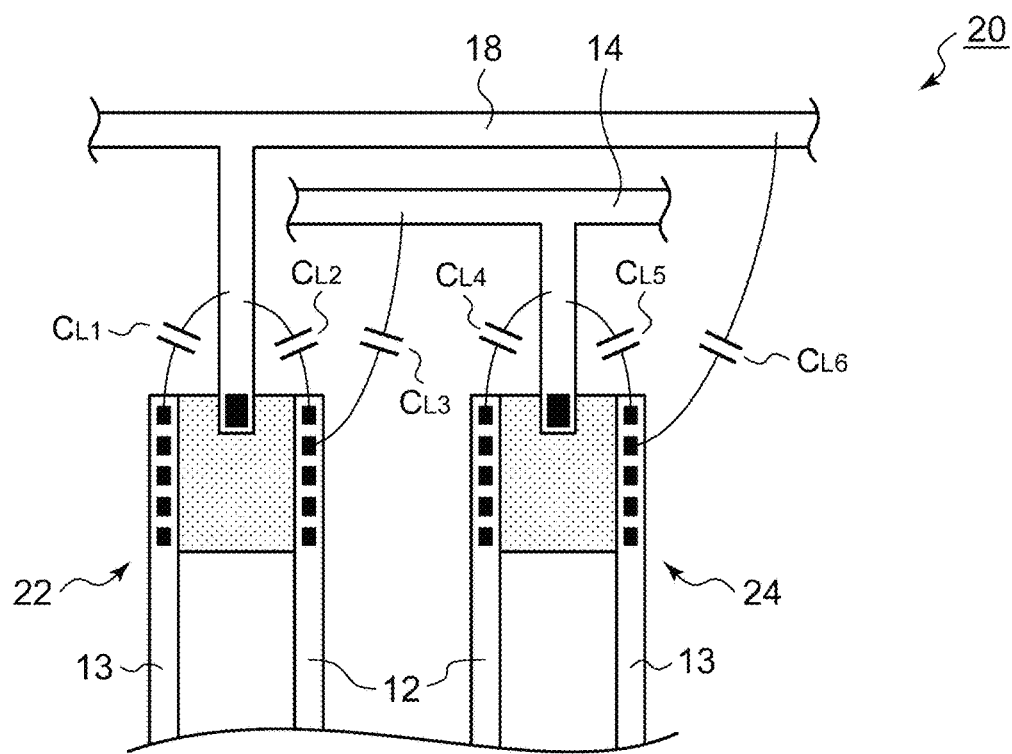
FIG. 13 is a general layout diagram of the CMOS switch.

Since the high impedance line 12 and gate lines 14, 16, and 18 are close to each other, parasitic capacitances $C_{P1}$ and $C_{P2}$ are generated therebetween. The parasitic capacitances $C_{P1}$ and $C_{P2}$ include an inter-wire capacitance, in addition to gate-source capacitances and gate-drain capacitances of the MOS transistors. FIG. 13 is a general layout diagram of the CMOS switch 20. In FIG. 13, inter-wire capacitances $C_{L1}$ to $C_{L6}$ are illustrated.

In FIG. 12, crosstalk via the parasitic capacitances $C_{P1}$ and $C_{P2}$ causes voltage fluctuation of the high impedance line 12 and movement of charges of the capacitor $C_S$, which causes noises. The same applies to the parasitic capacitance between an input line 13 and the gate lines 14, 16, and 18.

In related art, a measure such as suppressing the crosstalk by using a shield wiring for a clock line has been taken. However, this measure was insufficient in some cases, depending on a use of the CMOS switch.

Further, there is a problem that it is difficult to ensure symmetry of a layout as illustrated in FIG. 13, and inter-wire capacitances $CL_1$ to $CL_6$ vary. This is a factor that deteriorates characteristics when a circuit is formed by combining a plurality of CMOS switches.

Hereinbelow, a configuration of a CMOS switch capable of reducing crosstalk or improving symmetry of a parasitic capacitance will be described. Although this CMOS switch can be suitably incorporated in the sample hold circuit described above, a use thereof is not limited to the sample hold circuit.

Figure 14:
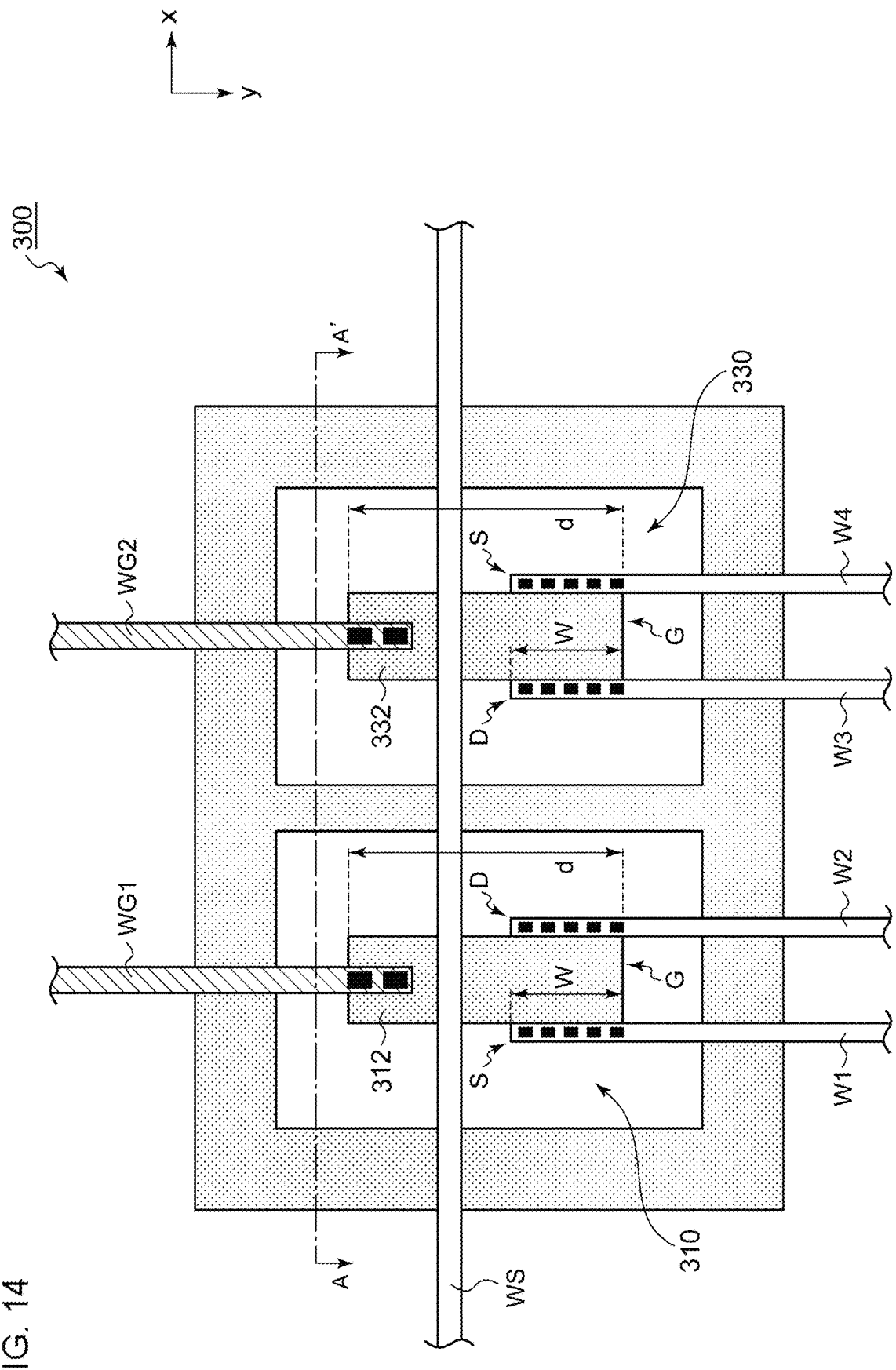
FIG. 14 is a layout diagram of a CMOS switch according to the embodiment.

FIG. 14 is a layout diagram of a CMOS switch 300 according to the embodiment. The CMOS switch 300 includes an NMOS transistor 310 and a PMOS transistor 330 electrically connected in parallel. The NMOS transistor 310 and the PMOS transistor 330 are disposed adjacent to each other on a semiconductor substrate in a first direction (an x direction in the drawing). Drains, gates, and sources of the NMOS transistor 310 and the PMOS transistor 330 are disposed in the first direction (or a direction opposite to the first direction). Note that a distinction between a drain D and a source S is made for convenience, and they can be interchanged. In the drawing, filled portions represent contacts.

Wirings W1 to W4 are drawn out from the drain D and the source S of each of the NMOS transistor 310 and the PMOS transistor 330 in a second direction (a y direction in the drawing) orthogonal to the first direction.

Gates 312 and 332 of the NMOS transistor 310 and the PMOS transistor 330 are extended so as to have a dimension d (referred to as a gate width) longer than a channel width W in a direction opposite to the second direction (a y-axis negative direction in the drawing). In a general element structure, the gate width d and the channel width W are equal, but in the present embodiment, they do not match and d>W. The channel width W is defined by widths of a drain region and a source region where impurities are diffused.

Further, gate lines WG1 and WG2 are respectively drawn out from an end of the gate 312 of the NMOS transistor 310 and an end of the gate 332 of the PMOS transistor 330 in the direction opposite to the second direction (the y-axis negative direction).

A shield line WS is formed so as to cross with the gates 312 and 332 of the NMOS transistor 310 and the PMOS transistor 330 and extend in the first direction (an x-axis direction). That is, the shield line WS blocks electrical coupling between contacts of the drains (D) and the sources (S) and the contacts of the gates (G). The shield line WS is grounded, and a potential thereof is fixed.

Figure 15:
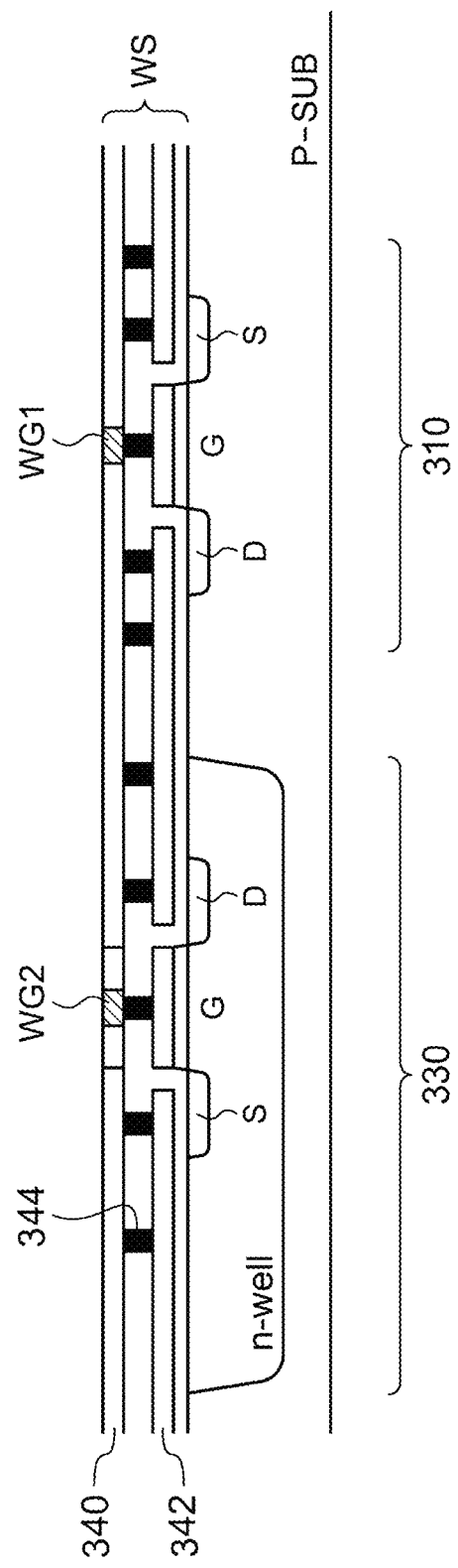
FIG. 15 is a cross-sectional view of the CMOS switch of FIG. 14 taken along a line A-A'.

FIG. 15 is a cross-sectional view of the CMOS switch 300 of FIG. 14 taken along a line A-A'. The shield line WS has a multilayer wiring structure. In this example, the shield line WS includes a wiring 340 formed in a first layer, a wiring 342 formed in a second layer, and via holes 344 connecting the wirings 340 and 342.

The above is the configuration of the CMOS switch 300. Next, an advantage of the CMOS switch 300 will be described.

In the CMOS switch 300, the gates 312 and 332 of the NMOS transistor 310 and the PMOS transistor 330 are extended wider than the channel width W As a result, the contacts of the gates can be moved away from the contacts of the drains (the contacts of the sources) to lengthen a distance between the gate lines WG1 and WG2 and the drain/source wirings W1 to W4. With this arrangement, an inter-wire capacitance between the gate lines WG1 and WG2 and the drain/source wirings W1 to W4 can be reduced, and crosstalk can be suppressed.

In addition, the shield line WS is formed between the gate lines WG1 and WG2 and the drain/source wirings W1 to W4 in a direction orthogonal to the gate lines WG1 and WG2 and the drain/source wirings W1 to W4. As a result, parasitic capacitances are generated between the drain/source wirings W1 to W4 and the shield line WS, instead of between the drain/source wirings W1 to W4 and the gate lines. As a result, coupling between the drain/source wirings W1 to W4 and the gate lines WG1 and WG2 is weakened and the crosstalk can be further reduced.

In addition, when focusing on the NMOS transistor 310, because of symmetry of the drain and the source, a parasitic capacitance between the drain wiring W2 and the shield line WS and a parasitic capacitance between the source wiring W1 and the shield line WS become substantially equal, and imbalance in the parasitic capacitance is also eliminated. The same applies to the PMOS transistor 330. Furthermore, even when a plurality of the CMOS switches 300 of FIG. 14 is arranged, symmetry of the parasitic capacitances can be maintained.

Further, as illustrated in FIG. 15, the crosstalk between the gate lines and the drain wirings (the source wirings) can be further reduced by multilaying the shield line WS.

Figure 16B:
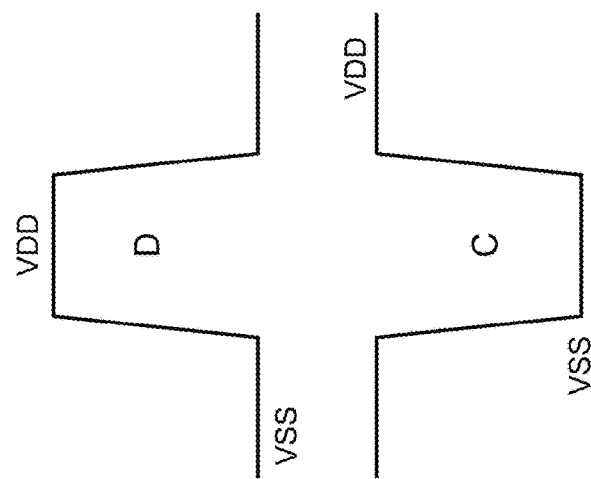
FIG. 16B is a diagram illustrating a gate clock.
Figure 16A:
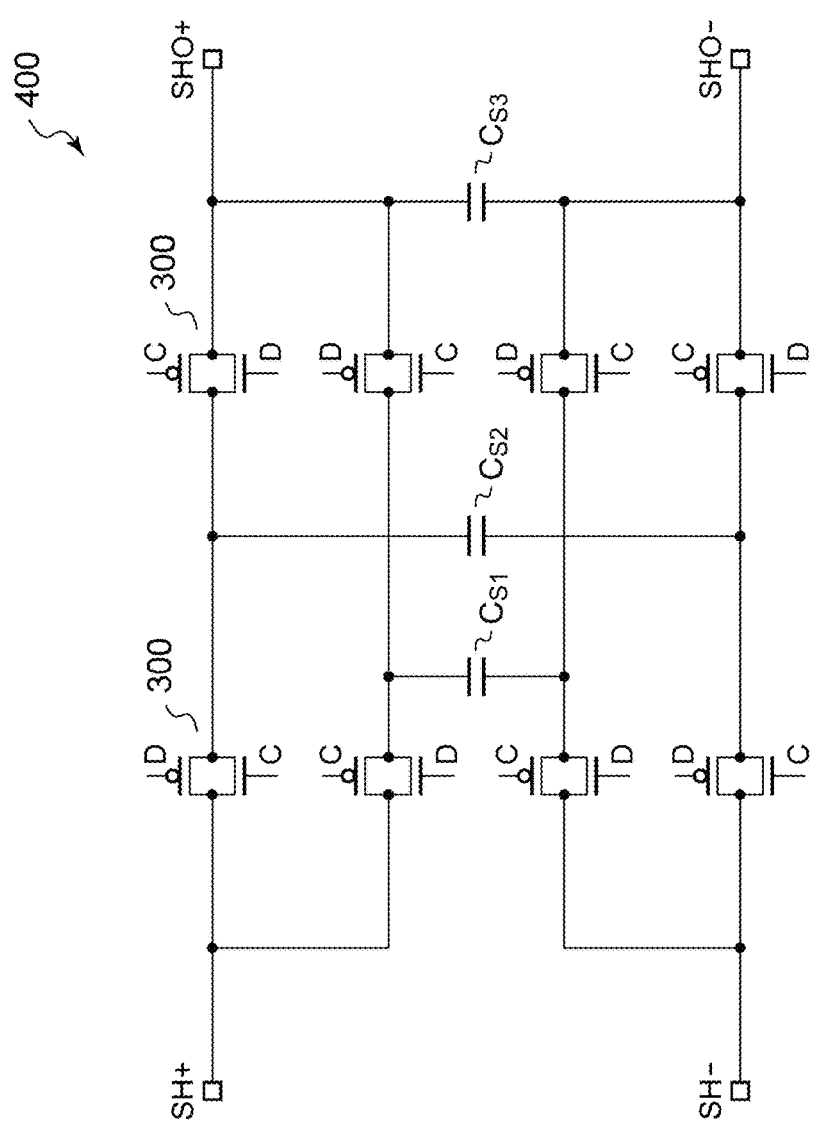
FIG. 16A is a circuit diagram of a sample hold circuit in a differential form including the CMOS switch of FIG. 14.

FIG. 16A is a circuit diagram of a sample hold circuit in a differential form including the CMOS switch 300 of FIG. 14, and FIG. 16B is a diagram illustrating a gate clock. A sample hold circuit 400 in FIG. 16A includes a plurality of capacitors $C_{S1}$ to $C_{S3}$ and a plurality of the CMOS switches 300. The plurality of CMOS switches 300 is driven by complementary gate clocks C and D illustrated in FIG. 16B. Each of the plurality of CMOS switches 300 has the layout of FIG. 14.

Figure 17A:
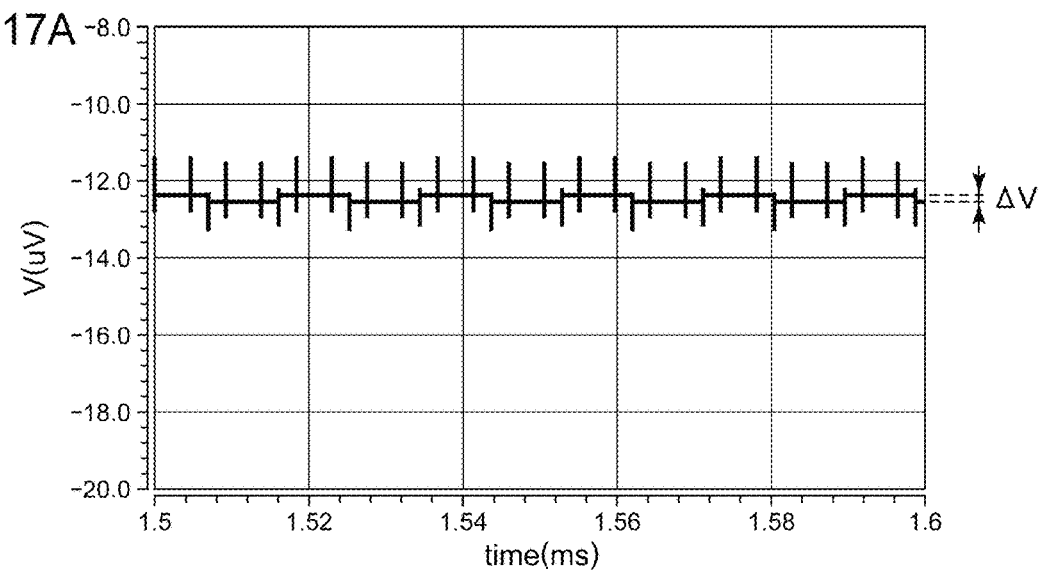
FIG. 17A and FIG. 17B are operation waveform diagrams of the sample hold circuit of FIG. 16A.
Figure 17B:
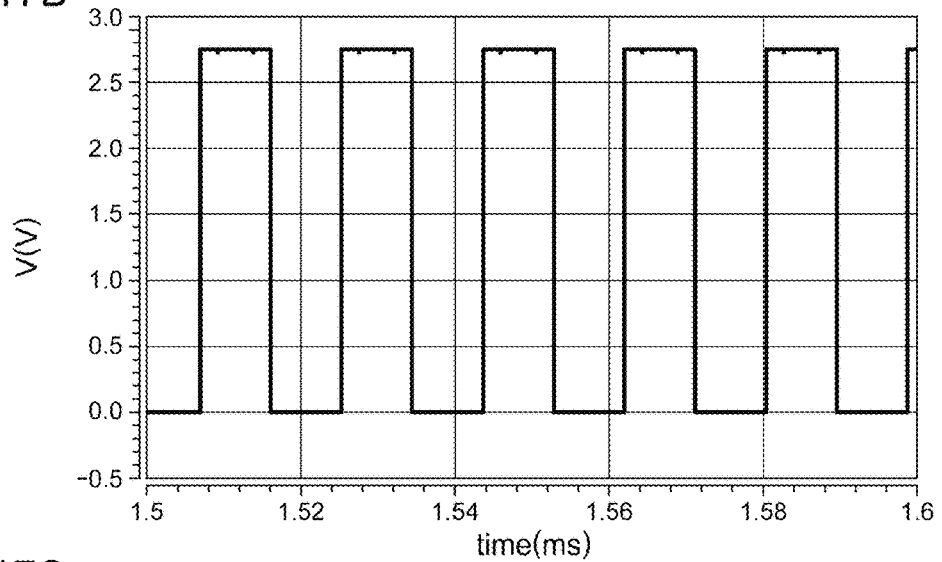
Figure 17C:
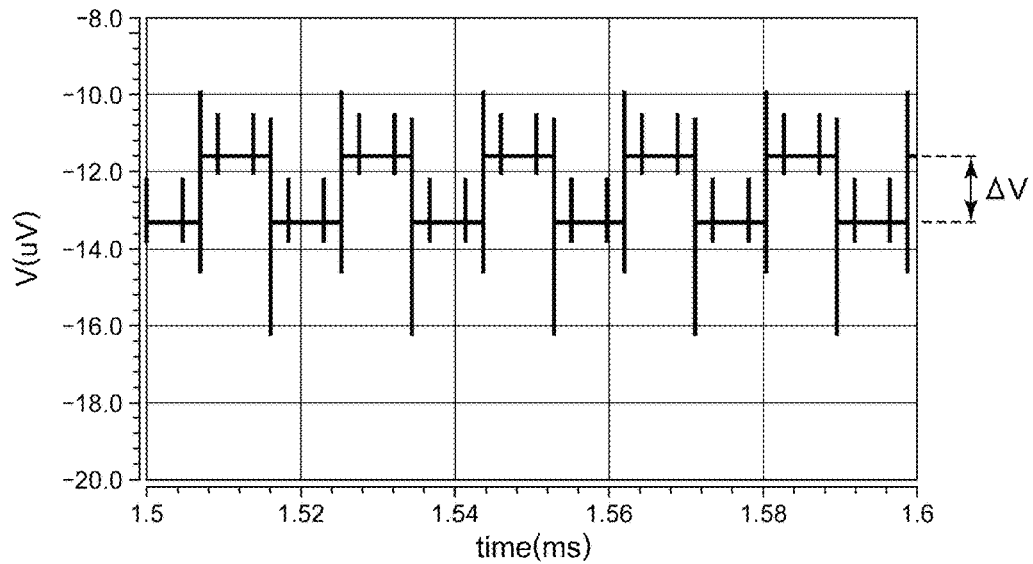
FIG. 17C is a diagram illustrating a waveform of an output voltage of a sample hold circuit including the CMOS switch having a layout of FIG. 13.

FIG. 17A and FIG. 17B are operation waveform diagrams of the sample hold circuit 400 of FIG. 16A. FIG. 17A illustrates an output voltage of the sample hold circuit 400, and FIG. 17B illustrated the gate clock C. For comparison, FIG. 17C illustrates a waveform of an output voltage of a sample hold circuit including the CMOS switch 20 having a layout of FIG. 13. Note that the output voltage of the sample hold circuit indicates a differential component (SHO$_+$−SHO$_-$).

Ideally the output voltage is constant. However, referring to FIG. 17C, in a design method in related art, the output voltage of the sample hold circuit fluctuates with amplitude of ΔV≈2 µV or so in synchronization with the gate clock.

In contrast, by configuring the sample hold circuit 400 using the CMOS switch 300 of FIG. 14; an influence of the crosstalk is reduced. Therefore, a fluctuation range ΔV of the output voltage can be suppressed to about 0.2 µV as illustrated in FIG. 17A.

In particular, in the CMOS switch 300 of FIG. 14; there is symmetry between the inter-wire capacitance of a drain side and the inter-wire capacitance of a source side. Further, the symmetry can be easily maintained even when the plurality of the CMOS switches 300 of FIG. 14 is arranged. This advantage is particularly suitable for a circuit including a plurality of CMOS switches which is required to have symmetry as in the sample hold circuit 400 of FIG. 16A.

The present invention has been described above based on the embodiments. It is to be understood by those skilled in the art that the embodiments are merely examples, various modifications can be made to a combination of each structural component and each process, and such modifications are also within the scope of the present invention. Hereinbelow, such modifications will be described.

Modification 1

A shield line WS may be a power supply line to which a bypass capacitor having a large capacitance is connected.

Modification 2

A gate width d of gates 312 and 332 may be further widened so that two shield wirings WS are formed adjacently in a second direction.

While the preferred embodiments of the present invention have been described using specific terms, such description is for illustrative purposes only, and it is to be understood that changes and variations may be made without departing from the spirit or scope of the appended claims.

Supplementary Note

The following technical ideas are disclosed in the present specification. (Item 1) A CMOS switch including an NMOS transistor and a PMOS transistor connected in parallel, in which the NMOS transistor and the PMOS transistor are disposed adjacent to each other on a semiconductor substrate in a first direction, wirings are drawn out from a drain and a source of each of the NMOS transistor and the PMOS transistor in a second direction orthogonal to the first direction, a gate of each of the NMOS transistor and the PMOS transistor is extended in a direction opposite to the second direction so as to have a dimension longer than a channel width, a gate line is drawn out from an end of the gate of each of the NMOS transistor and the PMOS transistor in the direction opposite to the second direction, and a shield line crossing with the gate and extending in the first direction is formed.

(Item 2) The CMOS switch according to item 1, in which the shield line is grounded.

(Item 3) The CMOS switch according to item 1 or 2, in which the shield line is a multilayer wiring.

(Item 4) A sample hold circuit including the CMOS switch according to any one of items 1 to 3.

What is claimed is:

1. A sample hold circuit integrated on a semiconductor chip, comprising:
   a power supply pin to be coupled to receive a power supply voltage;
   at least one capacitor; and
   a plurality of complementary metal-oxide semiconductor (CMOS) switches,
   wherein each of the plurality of CMOS switches includes an N-channel metal-oxide semiconductor (NMOS) transistor and a P-channel metal-oxide semiconductor (PMOS) transistor connected in parallel, and
   a high level of a gate signal of the NMOS transistor is lower than the power supply voltage,
   wherein
   the sample hold circuit further includes:
   a voltage source structured to generate a predetermined internal voltage lower than the power supply voltage; and
   a plurality of inverters each of which is provided to corresponding one of the plurality of CMOS switches, each of which has its input terminal coupled to receive a gate signal of the PMOS transistor of the corresponding one of the plurality of CMOS switches, its power supply terminal coupled to receive the predetermined internal voltage and its output terminal coupled to a gate of the NMOS transistor of the corresponding one of the plurality of CMOS switches.

2. The sample hold circuit according to claim 1, wherein the voltage source includes a dummy switch disposed close to the CMOS switch, and is capable of adjusting the internal voltage in accordance with an on-resistance of the dummy switch.

3. A sample hold circuit integrated on a semiconductor chip, comprising:
   a power supply pin to be coupled to receive a power supply voltage;
   at least one capacitor; and
   at least one complementary metal-oxide semiconductor (CMOS) switch,
   wherein each of the at least one CMOS switch includes an N-channel metal-oxide semiconductor (NMOS) transistor and a P-channel metal-oxide semiconductor (PMOS) transistor connected in parallel, and
   a high level of a gate signal of the NMOS transistor is lower than the power supply voltage,
   wherein the NMOS transistor and the PMOS transistor are disposed adjacent to each other on a semiconductor substrate in a first direction,
   wirings are drawn out from a drain and a source of each of the NMOS transistor and the PMOS transistor in a second direction orthogonal to the first direction,
   a gate of each of the NMOS transistor and the PMOS transistor is extended in a direction opposite to the second direction so as to have a dimension longer than a channel width,
   a gate line is drawn out from an end of the gate of each of the NMOS transistor and the PMOS transistor in the direction opposite to the second direction, and
   a shield line crossing with the gate and extending in the first direction is formed.

4. The sample hold circuit according to claim 3, wherein the shield line is grounded.

5. The sample hold circuit according to claim 3, wherein the shield line is a multilayer wiring.

6. A semiconductor device integrated on a semiconductor chip, comprising:
- a power supply pin to be coupled to receive a power supply voltage;
- a CMOS switch including an NMOS transistor and a PMOS transistor connected in parallel; and
- a gate voltage adjustment circuit structured to adjust a high level of a gate signal of the NMOS transistor to a voltage level lower than the power supply voltage,
- wherein the gate voltage adjustment circuit includes an amplifier structured to amplify a reference voltage, and an output voltage of the amplifier is supplied to a power supply terminal of a driver structured to drive a gate of the NMOS transistor.

7. The semiconductor device according to claim 6, wherein the gate voltage adjustment circuit includes a dummy switch disposed close to the CMOS switch, and adjusts the high level of the gate signal of the NMOS transistor in accordance with an on-resistance of the dummy switch.

8. The semiconductor device according to claim 6, wherein
- the NMOS transistor and the PMOS transistor are disposed adjacent to each other on a semiconductor substrate in a first direction,
- wirings are drawn out from a drain and a source of each of the NMOS transistor and the PMOS transistor in a second direction orthogonal to the first direction,
- a gate of each of the NMOS transistor and the PMOS transistor is extended in a direction opposite to the second direction so as to have a dimension longer than a channel width,
- a gate line is drawn out from an end of the gate of each of the NMOS transistor and the PMOS transistor in the direction opposite to the second direction, and
- a shield line crossing with the gate and extending in the first direction is formed.

9. The semiconductor device according to claim 8, wherein the shield line is grounded.

10. The semiconductor device according to claim 8, wherein the shield line is a multilayer wiring.

* * * * *